(12) United States Patent
Tanemura et al.

(10) Patent No.: US 10,466,848 B2
(45) Date of Patent: Nov. 5, 2019

(54) CDM EXCITATION ON FULL IN-CELL MATRIX SENSOR ARRAY WITH REDUCED BACKGROUND CAPACITANCE

(71) Applicant: SYNAPTICS INCORPORATED, San Jose, CA (US)

(72) Inventors: Tetsuo Tanemura, Tokyo (JP); Nobukazu Tanaka, Tokyo (JP); Takayuki Noto, Tokyo (JP)

(73) Assignee: SYNAPTICS INCORPORATED, San Jose, CA (US)

( * ) Notice: Subject to any disclaimer, the term of this patent is extended or adjusted under 35 U.S.C. 154(b) by 146 days.

(21) Appl. No.: 15/687,841

(22) Filed: Aug. 28, 2017

(65) Prior Publication Data

US 2019/0064956 A1   Feb. 28, 2019

(51) Int. Cl.

| | |
|---|---|
| *G06F 3/044* | (2006.01) |
| *G06F 3/041* | (2006.01) |
| *G09G 3/20* | (2006.01) |
| *H03K 17/955* | (2006.01) |
| *H03K 17/96* | (2006.01) |
| *G01R 27/26* | (2006.01) |

(52) U.S. Cl.
CPC ......... *G06F 3/044* (2013.01); *G01R 27/2605* (2013.01); *G06F 3/0412* (2013.01); *G06F 3/0416* (2013.01); *G09G 3/2055* (2013.01); *H03K 17/955* (2013.01); *H03K 17/962* (2013.01); *H03K 17/9622* (2013.01); *G06F 2203/04104* (2013.01); *H03K 2217/960775* (2013.01)

(58) Field of Classification Search
CPC ....... G01R 27/2605; G06F 2203/04104; G06F 3/0416; G06F 3/044; G06F 3/0412; G09G 3/2055; H03K 17/955; H03K 17/962; H03K 17/9622; H03K 2217/960775
See application file for complete search history.

(56) References Cited

U.S. PATENT DOCUMENTS

| | | | | |
|---|---|---|---|---|
| 8,338,724 | B2 * | 12/2012 | Reynolds | G06F 3/041 |
| | | | | 178/18.06 |
| 9,606,676 | B2 * | 3/2017 | Shepelev | G06F 3/0416 |
| 2012/0013565 | A1 * | 1/2012 | Westhues | G06F 3/0418 |
| | | | | 345/174 |

(Continued)

*Primary Examiner* — Dmitriy Bolotin
(74) *Attorney, Agent, or Firm* — Patterson + Sheridan, LLP

(57) ABSTRACT

Embodiments described herein include a method for detecting a presence of an input in a capacitive sensing device that includes a sensing region and a plurality of sensor electrodes. The method includes driving a first column of transmitter sensor electrodes at a first potential and driving a second column of transmitter sensor electrodes at a second potential different than the first potential. The method includes acquiring a measurement from each row of sensor electrodes, where a first sensing node includes the first column of transmitter sensor electrodes and a third column of receiver sensor electrodes, and a second sensing node includes the second column of transmitter sensor electrodes and a fourth column of receiver sensor electrodes. The method also includes determining, using the measurements from each row of sensor electrodes, a first set of transcapacitive measurements corresponding to the plurality of sensor electrodes.

20 Claims, 10 Drawing Sheets

(56) References Cited

U.S. PATENT DOCUMENTS

| | | | |
|---|---|---|---|
| 2014/0210764 A1* | 7/2014 | Shepelev | G06F 3/044 |
| | | | 345/174 |
| 2015/0029151 A1* | 1/2015 | Galambos | G06F 3/044 |
| | | | 345/174 |
| 2015/0261377 A1* | 9/2015 | Reynolds | G06F 3/0416 |
| | | | 345/174 |
| 2017/0315658 A1* | 11/2017 | Vandermeijden | G06F 3/0416 |
| 2017/0364184 A1* | 12/2017 | Weinerth | G06F 3/044 |
| 2018/0204036 A1* | 7/2018 | Akhavan Fomani | |
| | | | G06K 9/0002 |
| 2019/0056823 A1* | 2/2019 | Stevenson | G06F 3/044 |

\* cited by examiner

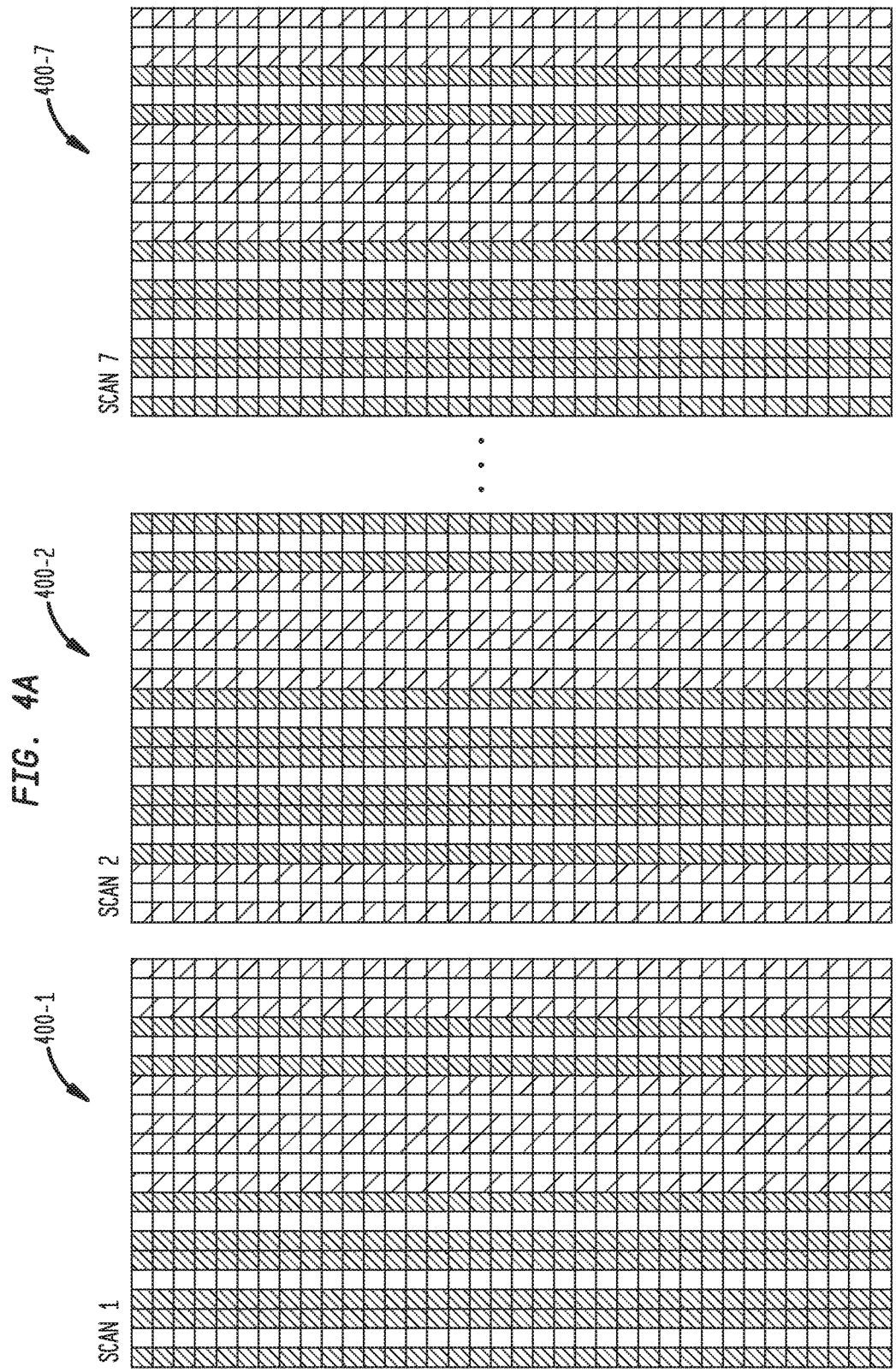

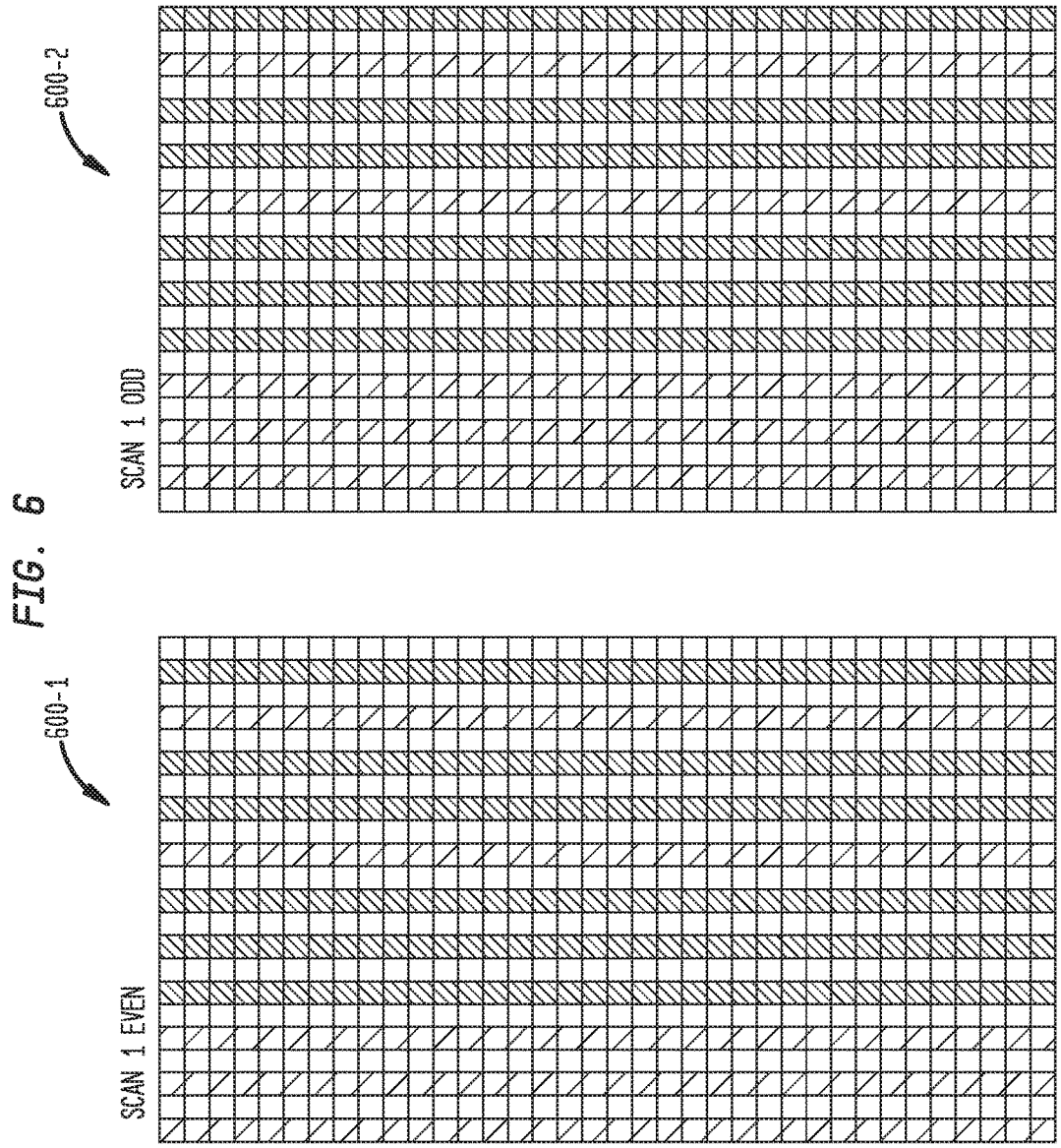

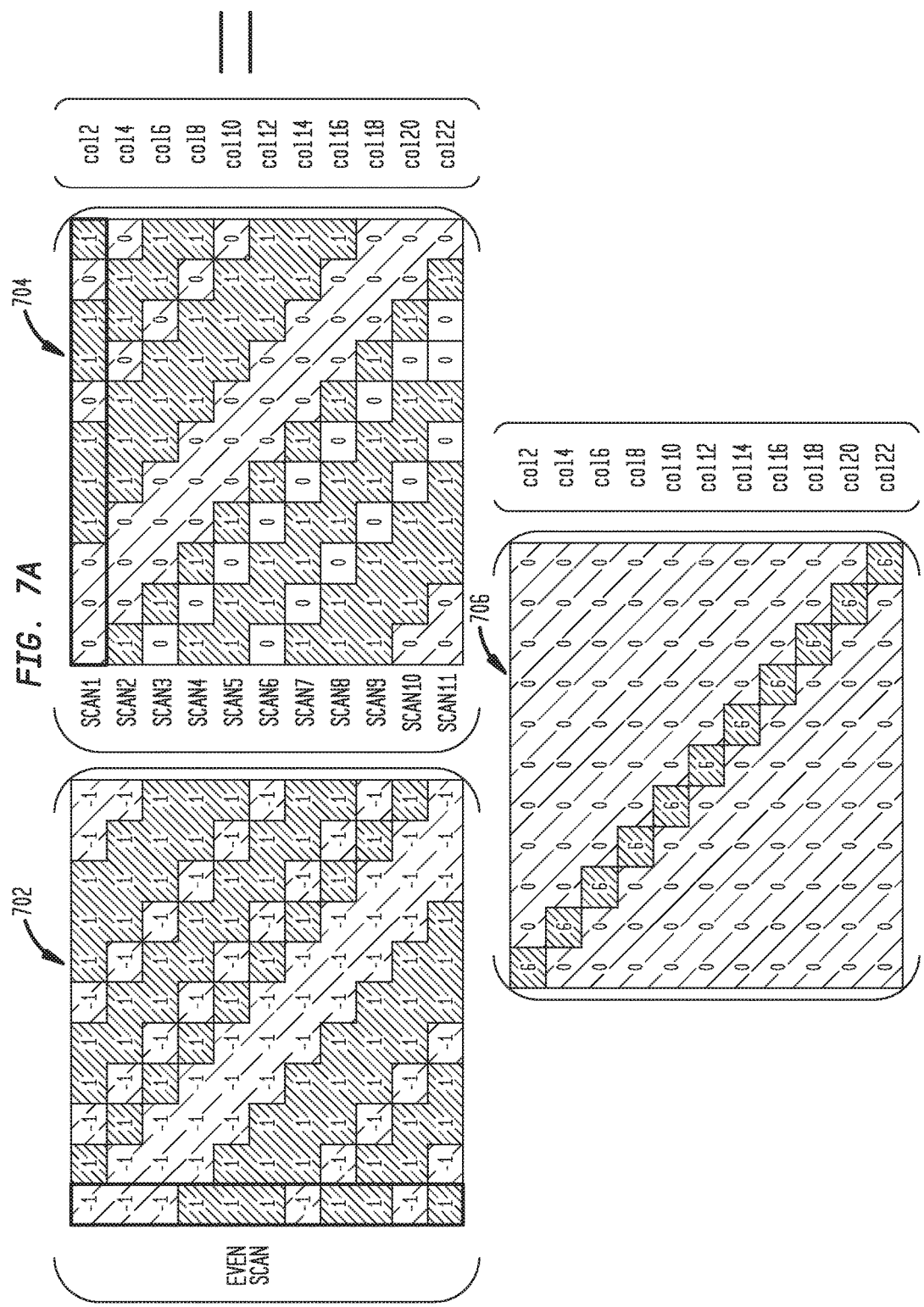

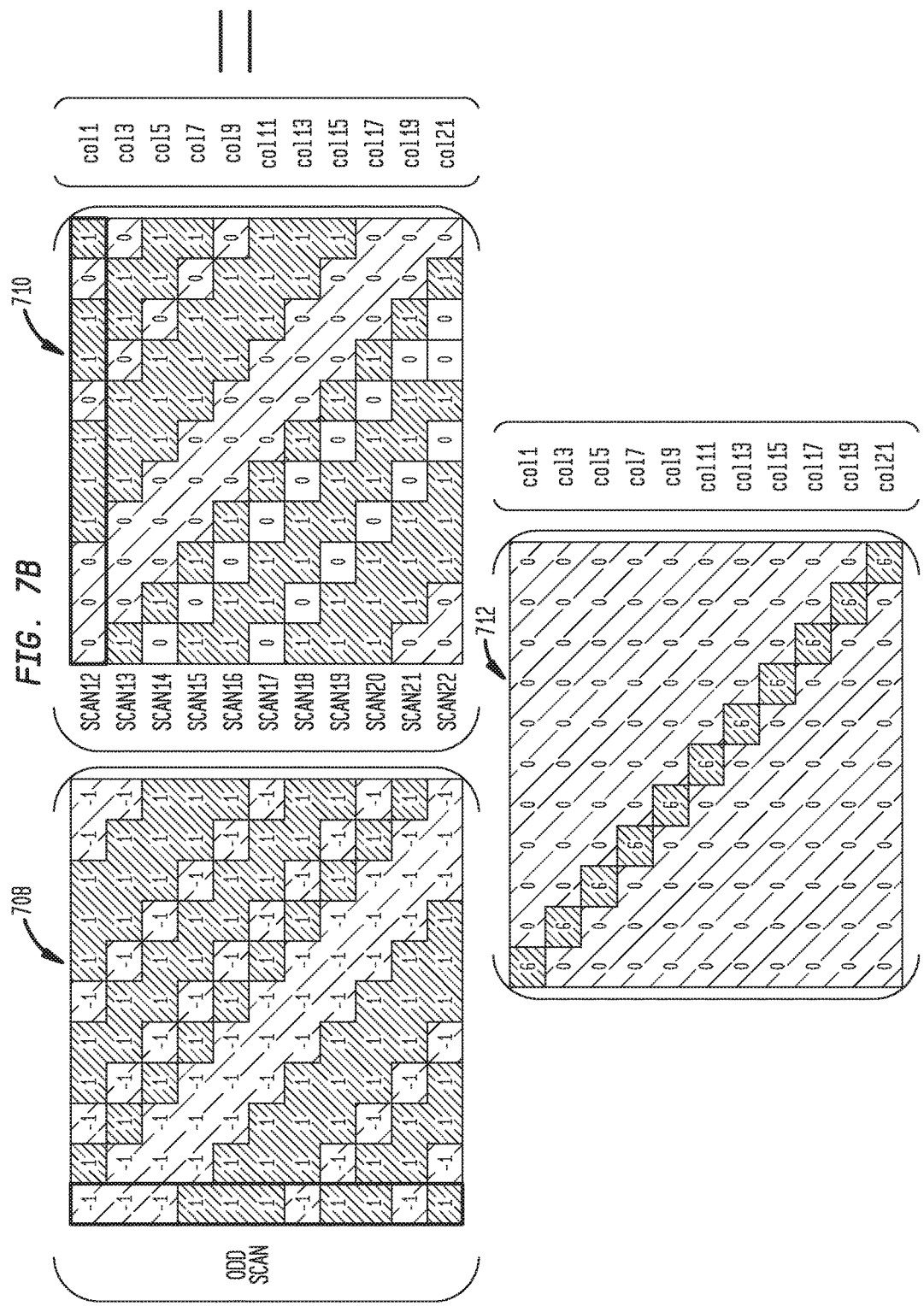

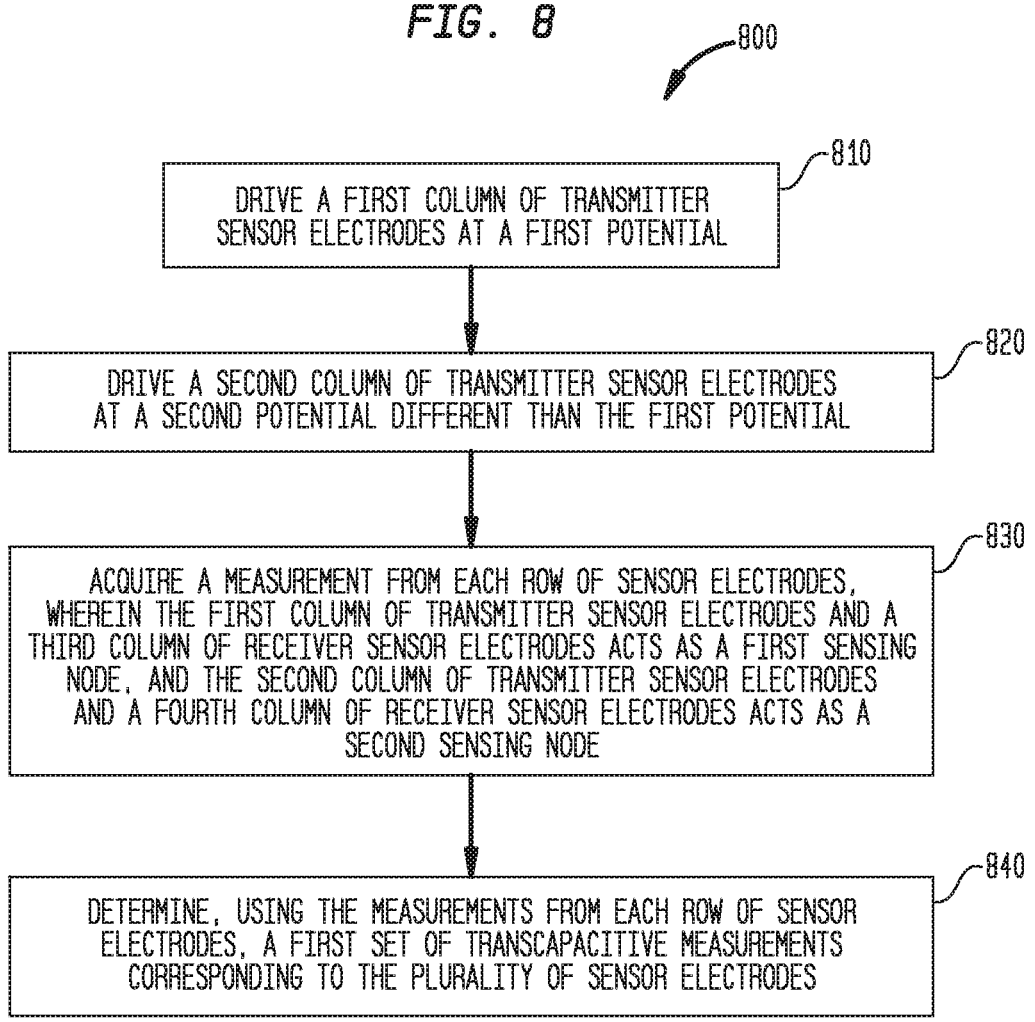

CDM EXCITATION ON FULL IN-CELL MATRIX SENSOR ARRAY WITH REDUCED BACKGROUND CAPACITANCE

BACKGROUND

Field of the Disclosure

Embodiments of the present invention generally relate to a method and apparatus for capacitive sensing, and more specifically, to reducing background capacitance in an input device.

Description of the Related Art

Input devices including proximity sensor devices (also commonly called touchpads or touch sensor devices) are widely used in a variety of electronic systems. An input device typically includes a sensing region, often demarked by a surface, in which the input device determines the presence, location and/or motion of one or more input objects. Input devices may be used to provide interfaces for the electronic system. For example, proximity sensor devices are often used as input devices for larger computing systems (such as opaque touchpads integrated in, or peripheral to, notebook or desktop computers). Input devices are also often used in smaller computing systems (such as touch screens integrated in cellular phones).

SUMMARY

Embodiments described herein include a method for detecting a presence of an input in a capacitive sensing device that includes a sensing region and a plurality of sensor electrodes. The method includes driving a first column of transmitter sensor electrodes at a first potential and driving a second column of transmitter sensor electrodes at a second potential different than the first potential. The method includes acquiring a measurement from each row of sensor electrodes, where the first column of transmitter sensor electrodes and a third column of receiver sensor electrodes comprise a first sensing node, and the second column of transmitter sensor electrodes and a fourth column of receiver sensor electrodes comprise a second sensing node. The method also includes determining, using the measurements from each row of sensor electrodes, a first set of transcapacitive measurements corresponding to the plurality of sensor electrodes.

Other examples include an input device for capacitive sensing configured to implement the method described above, and a processing system including processing circuitry configured to implement the method described above.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

FIG. 4A illustrates transmitter and receiver excitation patterns according to an example.

FIG. 6 illustrates another example of an excitation pattern according to an example.

FIG. 7A illustrates an example deconvolution for the excitation patterns illustrated in FIG. 6.

FIG. 7B illustrates another example deconvolution for the excitation patterns illustrated in FIG. 6.

FIG. 8 is a flow diagram illustrating a method for code division multiplexing excitation according to an example.

Figure 1:
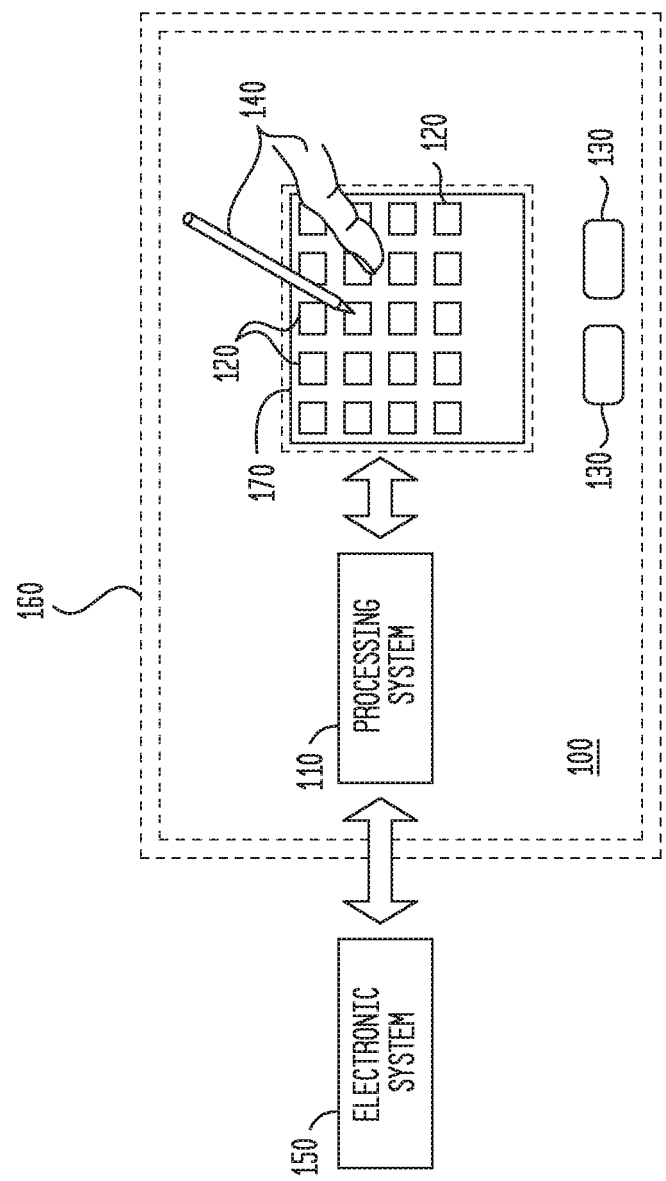
FIG. 1 is a block diagram of a system that includes an input device according to an example.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the embodiments or the application and uses of such embodiments. Furthermore, there is no intention to be bound by any expressed or implied theory presented in the preceding technical field, background, brief summary or the following detailed description.

Various embodiments of the present technology provide input devices and methods for improving usability. Particularly, embodiments described herein advantageously provide techniques for reducing background capacitance between sensor electrodes and metal routing lines near the electrodes. If the sensor electrodes in a vertical column are modulated the same way, capacitance between the sensor electrodes and the routing lines can be reduced. The voltage potential along each of the routing lines in a column will be the same, which reduces background capacitance between these closely situated routing lines. In one embodiment, a sensing node comprises three vertical columns of sensor electrodes, with two columns comprising transmitter sensor electrodes and one column comprising receiver sensor electrodes. In another embodiment, a sensing node comprises two vertical columns of sensor electrodes, with one column comprising transmitter sensor electrodes and one column comprising receiver sensor electrodes.

Turning now to the figures, FIG. 1 is a schematic block diagram of an input device 100 in accordance with embodiments of the present technology. In one embodiment, input device 100 comprises a display device comprising an integrated sensing device. Although the illustrated embodiments of the present disclosure are shown integrated with a display device, it is contemplated that the invention may be embodied in the input devices that are not integrated with display devices. The input device 100 may be configured to provide input to an electronic system 150. As used in this document, the term "electronic system" (or "electronic device")

broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 170. Example input objects 140 include fingers and styli, as shown in FIG. 1.

Sensing region 170 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 170 extends from a surface of the input device 100 in one or more directions into space until signal-to-noise ratios prevent sufficiently accurate object detection. The distance to which this sensing region 170 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 170 has a rectangular shape when projected onto an input surface of the input device 100.

The input device 100 may utilize any combination of sensor components and sensing technologies to detect user input in the sensing region 170. The input device 100 comprises a plurality of sensing elements 124 for detecting user input. The sensing elements 124 include a plurality of sensor electrodes 120, and may optionally include one or more grid electrodes 122. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements 124 pickup loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects 140 cause changes in the electric field, and produce detectable changes in capacitive coupling that may be detected as changes in voltage, current, or the like.

Some capacitive implementations utilize arrays or other regular or irregular patterns of capacitive sensing elements 124 to create electric fields. In some capacitive implementations, separate sensing elements 124 may be ohmically shorted together to form larger sensor electrodes. Some capacitive implementations utilize resistive sheets, which may be uniformly resistive.

As discussed above, some capacitive implementations utilize "self capacitance" (or "absolute capacitance") sensing methods based on changes in the capacitive coupling between sensor electrodes 120 and an input object 140. In various embodiments, an input object 140 near the sensor electrodes 120 alters the electric field near the sensor electrodes 120, thus changing the measured capacitive coupling. In one implementation, an absolute capacitance sensing method operates by modulating sensor electrodes 120 with respect to a reference voltage (e.g. system ground), and by detecting the capacitive coupling between the sensor electrodes 120 and input objects 140.

Additionally as discussed above, some capacitive implementations utilize "mutual capacitance" (or "transcapacitance") sensing methods based on changes in the capacitive coupling between sensor electrodes 120. In various embodiments, an input object 140 near the sensor electrodes 120 alters the electric field between the sensor electrodes 120, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes") as further described below. Transmitter sensor electrodes may be modulated relative to a reference voltage (e.g., system ground) to transmit a transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes 120 may be dedicated transmitter electrodes or receiver electrodes, or may be configured to both transmit and receive.

In FIG. 1, the processing system 110 is shown as part of the input device 100. The processing system 110 is configured to operate the hardware of the input device 100 to detect input in the sensing region 170. The processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) 124 of the input device 100. In other embodiments, components of processing system 110 are physically separate with one or more components close to sensing element(s) 124 of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) 124 to detect input, identification modules configured to identify gestures such as mode changing gestures, and mode changing modules for changing operation modes.

In some embodiments, the processing system 110 responds to user input (or lack of user input) in the sensing region 170 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) 124 of the input device 100 to produce electrical signals indicative of input (or lack of input) in the sensing region 170. The processing system 110 may perform any appropriate amount of processing on the electrical signals in producing the information provided to the electronic system. For example, the processing system 110 may digitize analog electrical signals obtained from the sensing elements 124. As another example, the processing system 110 may perform filtering, demodulation or other signal conditioning. In various embodiments, the processing system 110 generates a capacitive image directly from the resulting signals received with sensing elements 124 (sensor electrodes 120). In other embodiments, processing system 110 spatially filters (e.g., taking a difference, weighted sum of neighboring elements) the resulting signals received with sensing elements 124 (or sensor electrodes 120) to generate a sharpened or averaged image. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 170, or some other functionality. FIG. 1 shows buttons 130 near the sensing region 170 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 170 overlaps at least part of an active area of a display screen of the display device 160. For example, the input device 100 may comprise substantially transparent sensing elements 124 overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display device 160 may share physical elements. For example, some embodiments may utilize some of the same electrical components for displaying and sensing (e.g., the active matrix control electrodes configured to control the source, gate and/or Vcom voltages). Shared components may include display electrodes, substrates, connectors and/or connections. As another example, the display device 160 may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
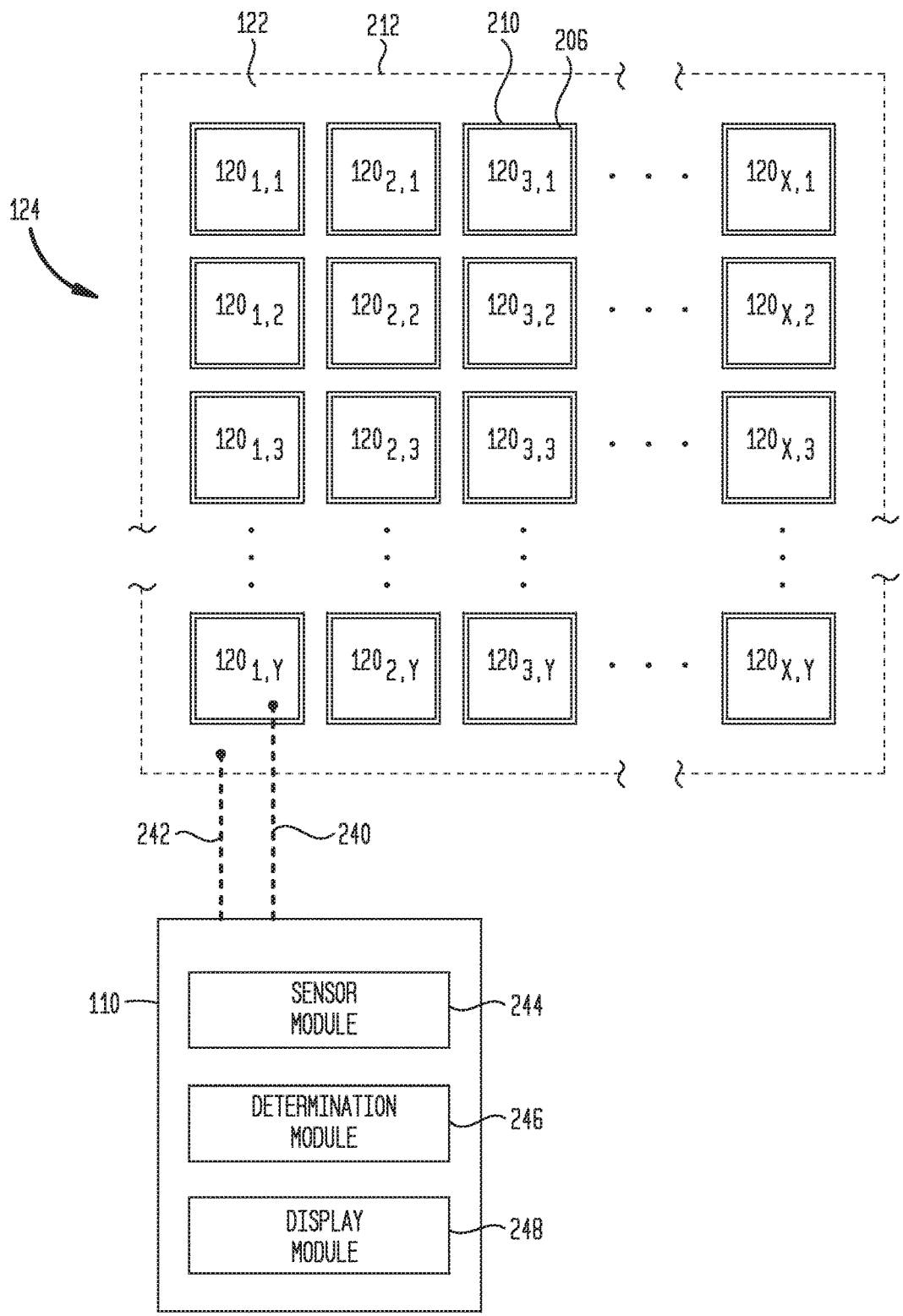
FIG. 2 is an example sensor electrode pattern according to an example.

FIG. 2 shows a portion of an exemplary pattern of sensing elements 124 configured to sense in the sensing region 170 associated with the pattern, according to some examples. For clarity of illustration and description, FIG. 2 shows the sensor electrodes 120 of the sensing elements 124 in a pattern of simple rectangles with the grid electrode 122 disposed therebetween, and does not show various other components. The exemplary pattern of sensing elements 124 comprises an matrix of sensor electrodes $120_{X,Y}$ (referred collectively as sensor electrodes 120) arranged in X columns and Y rows, wherein X and Y are positive integers, although one of X and Y may be zero. In one example, each column includes at least two sensor electrodes 120 and each row includes at least two sensor electrodes 120. It is contemplated that the pattern of sensing elements 124 may comprises a plurality of sensor electrodes 120 having other configurations, such as polar arrays, repeating patters, non-repeating patterns, a single row or column, or other suitable arrangement. Further, in various embodiments the number of sensor electrodes may vary from row to row and/or column to column. In one embodiment, at least one row and/or column of sensor electrodes 120 is offset from the others, such it extends further in at least one direction than the others. The sensor electrodes 120 and grid electrodes 122 are coupled to the processing system 110 and utilized to determine the presence (or lack thereof) of an input object 140 in the sensing region 170.

In a first mode of operation, the arrangement of sensor electrodes 120 (120-1, 120-2, 120-3, . . . 120-n) may be utilized to detect the presence of an input object 140 via absolute sensing techniques. That is, processing system 110 is configured to modulate sensor electrodes 120 to acquire measurements of changes in capacitive coupling between the modulated sensor electrodes 120 and an input object 140 to determine the position of the input object 140. Processing system 110 is further configured to determine changes of absolute capacitance based on a measurement of resulting signals received with sensor electrodes 120 which are modulated.

The sensor electrodes 120 are typically ohmically isolated from each other, and also ohmically isolated from the grid electrode 122. That is, one or more insulators separate the sensor electrodes 120 (and grid electrode 122) and prevent them from electrically shorting to each other. In some embodiments, the sensor electrodes 120 and grid electrode 122 are separated by insulative gap 206. The insulative gap 206 separating the sensor electrodes 120 and grid electrode 122 may be filled with an electrically insulating material, or may be an air gap. In some embodiments, the sensor electrodes 120 and the grid electrode 122 are vertically separated by one or more layers of insulative material. In some other embodiments, the sensor electrodes 120 and the grid electrode 122 are separated by one or more substrates; for example, they may be disposed on opposite sides of the same substrate, or on different substrates. In yet other embodiments, the grid electrode 122 may be composed of multiple layers on the same substrate, or on different substrates. In one embodiment, a first grid electrode may be formed on a first substrate or first side of a substrate and a second grid electrode may be formed on a second substrate or a second side of a substrate. For example, a first grid comprises one or more common electrodes disposed on a TFT layer of the display device 160 and a second grid electrode is disposed on the color filter glass of the display device 160. In one embodiment, the dimensions of the first grid electrode are equal to the dimensions of the second grid electrode. In one embodiment, at least one dimension of the first grid electrode differs from a dimension of the second grid electrode. For example, the first grid electrode may be configured such that is disposed between a first and second sensor electrode 120 and the second grid electrode may be configured such that it overlaps at least one of the first and second sensor electrodes 120 and the first grid electrode. Further, the first grid electrode may be configured such that it is disposed between a first and second sensor electrode 120 and the second grid electrode may be configured such that it only overlaps the first grid electrode and is smaller than the first grid electrode.

In a second mode of operation, the sensor electrodes 120 (120-1, 120-2, 120-3, . . . 120-n) may be utilized to detect the presence of an input object 140 via transcapacitive sensing techniques when a transmitter signal is driven onto the grid electrode 122. That is, processing system 110 is configured drive the grid electrode 122 with a transmitter signal and receive resulting signals with each sensor electrode 120, where a resulting signal comprising effects corresponding to the transmitter signal, which is utilized by the processing system 110 or other processor to determine the position of the input object 140.

In a third mode of operation, the sensor electrodes 120 may be split into groups of transmitter and receiver electrodes utilized to detect the presence of an input object 140 via transcapacitive sensing techniques. That is, processing system 110 may drive a first group of sensor electrodes 120 with a transmitter signal and receive resulting signals with the second group of sensor electrodes 120, where a resulting signal comprising effects corresponding to the transmitter signal. The resulting signal is utilized by the processing system 110 or other processor to determine the position of the input object 140.

The input device 100 may be configured to operate in any one of the modes described above. The input device 100 may also be configured to operate switch between any two or more of the modes described above.

The areas of localized capacitive sensing of capacitive couplings may be termed "capacitive pixels." Capacitive pixels may be formed between an individual sensor electrode 120 and reference voltage in the first mode of operation, between the sensor electrodes 120 and grid electrode 122 in the second mode of operation, and between groups of sensor electrodes 120 used as transmitter and receiver electrodes. The capacitive coupling changes with the proximity and motion of input objects 140 in the sensing region 170 associated with the sensing elements 124, and thus may be used as an indicator of the presence of the input object 140 in the sensing region of the input device 100.

In some embodiments, the sensor electrodes 120 are "scanned" to determine these capacitive couplings. That is, in one embodiment, one or more of the sensor electrodes 120 are driven to transmit a transmitter signals. Transmitters may be operated such that one transmitter electrode transmits at one time, or multiple transmitter electrodes transmit at the same time. Where multiple transmitter electrodes transmit simultaneously, the multiple transmitter electrodes may transmit the same transmitter signal and effectively produce an effectively larger transmitter electrode. Alternatively, the multiple transmitter electrodes may transmit different transmitter signals. For example, multiple transmitter electrodes may transmit different transmitter signals according to one or more coding schemes that enable their combined effects on the resulting signals of receiver electrodes to be independently determined. In one embodiment, multiple transmitter electrodes may simultaneously transmit the same transmitter signal while the receiver electrodes are received with using a scanning scheme.

The sensor electrodes 120 configured as receiver sensor electrodes may be operated singly or multiply to acquire resulting signals. The resulting signals may be used to determine measurements of the capacitive couplings at the capacitive pixels. Processing system 110 may be configured to receive with the sensor electrodes 120 in a scanning fashion and/or a multiplexed fashion to reduce the number of simultaneous measurements to be made as well as the size of the supporting electrical structures. In one embodiment, one or more sensor electrodes are coupled to a receiver of processing system 110 via a switching element such as a multiplexer or the like. In such an embodiment, the switching element may be internal to processing system 110 or external to processing system 110. In one or more embodiments, the switching elements may be further configured to couple a sensor electrode with a transmitter or other signal and/or voltage potential. In one embodiment, the switching element may be configured to couple more than one receiver electrode to a common receiver at the same time.

In other embodiments, "scanning" sensor electrodes 120 to determine these capacitive coupling comprises modulating one or more of the sensor electrodes and measuring an absolute capacitance of the one or sensor electrodes. In another embodiment, the sensor electrodes may be operated such that more than one sensor electrode is driven and received with at a time. In such embodiments, an absolute capacitive measurement may be obtained from each of the one or more sensor electrodes 120 simultaneously. In one embodiment each of the sensor electrodes 120 are simultaneously driven and received with, obtaining an absolute capacitive measurement simultaneously from each of the sensor electrodes 120. In various embodiments, processing system 110 may configured to selectively modulate a portion of sensor electrodes 120. For example, the sensor electrodes may be selected based on, but not limited to, an application running on the host processor, a status of the input device, and an operating mode of the sensing device. In various embodiments, processing system 110 may be configured to selectively shield at least portion of sensor electrodes 120 and to selectively shield or transmit with the grid electrode(s) 122 while selectively receiving and/or transmitting with other sensor electrodes 120.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects 140 entering, exiting, and within the sensing region.

In any of the above embodiments, multiple sensor electrodes 120 may be ganged together such that the sensor electrodes 120 are simultaneously modulated or simultaneously received with. As compared to the methods described above, ganging together multiple sensor electrodes 120 may produce a course capacitive image that may not be usable to discern precise positional information. However, a course capacitive image may be used to sense presence of an input object 140. In one embodiment, the course capacitive image may be used to move processing system 110 or the input device 100 out of a doze or low power mode. In one embodiment, the course capacitive image may be used to move a capacitive sensor integrated circuit out of a doze mode or low power mode. In another embodiment, the course capacitive image may be used to move a host integrated circuit out of a doze mode or low power mode. The course capacitive image may correspond to the entire sensor area or only to a portion of the sensor area.

The background capacitance of the input device 100 is the capacitive image associated with no input object 140 in the sensing region 170. The background capacitance changes with the environment and operating conditions, and may be estimated in various ways. For example, some embodiments take "baseline images" when no input object 140 is determined to be in the sensing region 170, and use those baseline images as estimates of their background capacitances. The background capacitance or the baseline capacitance may be present due to stray capacitive coupling between two sensor electrodes, where one sensor electrode is driven with a modulated signal and the other is held stationary relative to system ground or from stray capacitive coupling between a receiver electrode and nearby modulated electrodes. In many embodiment, the background or baseline capacitance may be relatively stationary over the time period of a user input gesture.

Capacitive images can be adjusted for the background capacitance of the input device 100 for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, one or more of the sensor electrodes 120 comprise one or more display electrodes used in updating the display of the display screen. The display electrodes may comprise one or more elements of the Active Matrix display such as one or more segments of a segmented Vcom electrode (common electrode(s)), a source drive line, gate line, an anode sub-pixel electrode or cathode pixel electrode, or any other display element. These display electrodes may be disposed on an appropriate display screen substrate. For example, the common electrodes may be disposed on the a transparent substrate (a glass substrate, TFT glass, or any other transparent material) in some display screens (e.g., In Plane Switching (IPS), Fringe Field Switching (FFS) or Plane to Line Switching (PLS) Organic Light Emitting Diode (OLED)), on the bottom of the color filter glass of some display screens (e.g., Patterned Vertical Alignment (PVA) or Multi-domain Vertical Alignment (MVA)), over an emissive layer (OLED), etc. In such embodiments, the display electrode can also be referred to as a "combination electrode", since it performs multiple functions. In various embodiments, each of the sensor electrodes 120 comprises one or more common electrodes. In other embodiments, at least two sensor electrodes 120 may share at least one common electrode. While the following description may describe that sensor electrodes 120 and/or grid electrode 122 comprise one or more common electrodes, various other display electrodes as describe above may also be used in conjunction with the common electrode or as an alternative to the common electrodes. In various embodiments, the sensor electrodes 120 and grid electrode 122 comprise the entire common electrode layer (Vcom electrode).

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer of the display frame rate. In one or more embodiments, the display frame rate may change (e.g., to reduce power or to provide additional image data such as a 3D display information) while touch frame rate maintains constant. In other embodiment, the display frame rate may remain constant while the touch frame rate is increased or decreased.

Continuing to refer to FIG. 2, the processing system 110 coupled to the sensor electrodes 120 includes a sensor module 244 and optionally, a display module 248. The sensor module 244 includes circuitry configured to drive at least one of the sensor electrodes 120 for capacitive sensing during periods in which input sensing is desired. In one embodiment, the sensor module 244 is configured to drive a modulated signal onto the at least one sensor electrode 120 to detect changes in absolute capacitance between the at least one sensor electrode 120 and an input object 140. In another embodiment, the sensor module 244 is configured to drive a transmitter signal onto the at least one sensor electrode 120 to detect changes in a transcapacitance between the at least one sensor electrode 120 and another sensor electrode 120. The modulated and transmitter signals are generally varying voltage signals comprising a plurality of voltage transitions over a period of time allocated for input sensing. In various embodiments, the sensor electrodes 120 and/or grid electrode 122 may be driven differently in different modes of operation. In one embodiment, the sensor electrodes 120 and/or grid electrode 122 may be driven with signals (modulated signals, transmitter signals and/or shield signals) that may differ in any one of phase, amplitude and/or shape. In various embodiments, three modulated signal and transmitter signal are similar in at least one shape, frequency, amplitude and/or phase. In other embodiments, the modulated signal and the transmitter signals are different in frequency, shape, phase, amplitude and phase. The sensor module 244 may be selectively coupled one or more of the sensor electrodes 120 and/or the grid electrode 122. For example, the sensor module 244 may be coupled selected portions of the sensor electrodes 120 and operate in either an absolute or transcapacitive sensing mode. In another example, the sensor module 244 may be a different portion of the sensor electrodes 120 and operate in either an absolute or transcapacitive sensing mode. In yet another example, the sensor module 244 may be coupled to all the sensor electrodes 120 and operate in either an absolute or transcapacitive sensing mode. The sensor module 244 is also configured to operate the grid electrode 122 as a shield electrode. Processing system 110 is configured to operate the grid electrode 122 as a shield electrode that may shield the sensor electrodes 120 from the electrical effects of nearby conductors. In one embodiment, processing system is configured to operate the grid electrode 122 as a shield electrode that may shield sensor electrodes 120 from the electrical effects of nearby conductors and guard the sensor electrodes 120 from grid electrode 122, at least partially reducing the parasitic capacitance between the grid electrode 122 and the sensor electrodes 120. In one embodiment, a shielding signal is driven onto the grid electrode 122. The shielding signal may be a ground signal, such as the system ground or other ground, or any other constant voltage (i.e., non-modulated) signal. In another embodiment, operating the grid electrode 122 as a shield electrode may comprise electrically floating the grid electrode. In an embodiment, grid electrode 122 is able to operate as an effective shield electrode while being electrode floated due to its large coupling to the other sensor electrodes 120. In other embodiment, the shielding signal may be referred to as a guarding signal where the guarding signal is a varying voltage signal having at least one of a similar phase, frequency and amplitude as the modulated signal driven on to the sensor electrodes. In one or more embodiment, routing (e.g., traces 240 and/or 242) may be shielded from responding to an input object 140 due to routing beneath the grid electrode 122 and/or sensor electrodes 120, and therefore may not be part of the active sensor electrodes, shown as sensor electrodes 120.

In one or more embodiments, capacitive sensing (or input sensing) and display updating may occur during at least partially overlapping periods. For example, as a common electrode is driven for display updating, the common electrode may also be driven for capacitive sensing. In another embodiment, capacitive sensing and display updating may occur during non-overlapping periods, also referred to as non-display update periods. In various embodiments, the non-display update periods may occur between display line update periods for two display lines of a display frame and may be at least as long in time as the display update period. In such embodiment, the non-display update period may be referred to as a long horizontal blanking period, long h-blanking period or a distributed blanking period, where the blanking period occurs between two display updating periods and is at least as long as a display update period. In one embodiment, the non-display update period occurs between display line update periods of a frame and is long enough to allow for multiple transitions of the transmitter signal to be driven onto the sensor electrodes 120. In other embodiments, the non-display update period may comprise horizontal blanking periods and vertical blanking periods. Processing system 110 may be configured to drive sensor electrodes 120 for capacitive sensing during any one or more of or any combination of the different non-display update times. Synchronization signals may be shared between sensor module 244 and display module 248 to provide accurate control of overlapping display updating and capacitive sensing periods with repeatably coherent frequencies and phases. In one embodiment, these synchronization signals may be configured to allow the relatively stable voltages at the beginning and end of the input sensing period to coincide with display update periods with relatively stable voltages (e.g. near the end of a input integrator reset time and near the end of a display charge share time). A modulation frequency of a modulated or transmitter signal may be at a harmonic of the display line update rate, where the phase is determined to provide a nearly constant charge coupling from the display elements to the receiver electrode, allowing this coupling to be part of the baseline image.

The sensor module 244 includes circuitry configured to receive resulting signals with the sensing elements 124 comprising effects corresponding to the modulated signals or the transmitter signals during periods in which input sensing is desired. The sensor module 244 may determine a position of the input object 140 in the sensing region 170 or may provide a signal including information indicative of the resulting signal to another module or processor, for example, determination module 246 or a processor of the electronic system 150 (i.e., a host processor), for determining the position of the input object 140 in the sensing region 170.

The display module 248 may be included in or separate from the processing system 110. The display module 248 includes circuitry confirmed to provide display image update information to the display of the display device 160 during non-sensing (e.g., display updating) periods. In one embodiment, the sensor module 244, and display module 248 may be comprised within a common integrated circuit (first controller). In another embodiment, two of the sensor module 244, sensor module 244 and display module 248 are be comprised in a first integrated circuit and the other one of the three modules is comprised in a second integrated circuit. In those embodiments comprising multiple integrated circuits, a synchronization mechanism may be coupled between them, configured to synchronize display updating periods, sensing periods, transmitter signals, display update signals and the like.

As discussed above, the sensor electrodes 120 of the sensing elements 124 may be formed as discrete geometric forms, polygons, bars, pads, lines or other shape, which are ohmically isolated from one another. In various embodiments, ohmically isolated comprises passively isolated, where active switches may be configured to couple different sensor electrodes to the same signal during a period of time. The sensor electrodes 120 may be electrically coupled through circuitry to form electrodes of having larger plan area relative to a discrete one of the sensor electrodes 120. The sensor electrodes 120 may be fabricated from opaque or non-opaque conductive materials, or the combination of the two. In embodiments wherein the sensor electrodes 120 are utilized with a display device, it may be desirable to utilize non-opaque conductive materials for the sensor electrodes 120. In embodiments wherein the sensor electrodes 120 are not utilized with a display device, it may be desirable to utilize opaque conductive materials having lower resistivity for the sensor electrodes 120 to improve sensor performance. Materials suitable for fabricating the sensor electrodes 120 include ITO, aluminum, silver, copper, molybdenum and conductive carbon materials, among others and various sensor electrodes may be formed of a deposited stack of different conductive materials. The sensor electrodes 120 may be formed as contiguous body of conductive material having little or no open area (i.e., having a planar surface uninterrupted by holes), or may alternatively be fabricated to form a body of material having openings formed therethrough. For example, the sensor electrodes 120 may be formed a from mesh of conductive material, such as a plurality of interconnected thin metal wires. In one embodiment, at least one of the length and width of the sensor electrodes 120 may be in a range of about 1 to about 2 mm. In other embodiments, at least one of the length and width of the sensor electrodes may be less than about 1 mm or greater than about 2 mm. In other embodiment, the length and width may not similar, and one of the length and width may be in the range of about 1 to about 2 mm. Further, in various embodiments, the sensor electrodes 120 may comprise a center to center pitch in the range of about 4 to about 5 mm; however, in other embodiments, the pitch may be less than about 4 mm or greater than about 5 mm.

The grid electrode 122 may be fabricated similar to the sensor electrodes 120. The sensor electrodes 120 and the grid electrode 122 may be coupled to the processing system 110 utilizing conductive routing traces 240, 242 (shown in phantom). The conductive routing traces 240, 242 may be formed in the same plane at least one of the sensor electrodes 120 and the grid electrode 122, or may be formed on one or more separate substrates and connected to the respective electrodes 120, 122 by vias (not shown). Conductive routing traces 240 and 242 may be formed on a metal layer disposed such that the sensor electrodes 120 are between the metal layer and the input object 140. In one embodiment the metal layer comprises source driver lines and/or gate lines for a display device. The conductive routing traces 240, 242, and vias between them may be obscured from a user by a black mask layer disposed between them and the user of the display device. At least one of the conductive routing traces 240 and 242 may comprise one or more routing traces (conductors) in the source driver metal layer. In one or more embodiments such a layer may be referred to as metal interconnect layer two. Further, conductive routing traces 240 and/or 242 may be disposed on a metal layer between source driver lines. Alternately, at least one of the conductive routing traces 240 and 242 may comprise one or more conductors in the gate driver metal layer or gate driver lines not configured for display updating. Further, conductive routing traces 240 and/or 242 may be disposed on a metal layer between gate driver lines. In another embodiment, at least one of the conductive routing traces 240 and 242 may comprise one or more conductors in the Vcom jumper metal layer or Vcom lines not otherwise configured for display updating. Further, conductive routing traces 240 and/or 242 may be disposed on a metal layer between gate electrodes. In other embodiments the metal layer is included in addition to a layer comprising the source driver lines and/or gate lines. A portion of the conductive traces 240, 242 may also be formed laterally outward of the areal bounds of the sensing elements 124. In various embodiments, the conductive routing traces 240 and/or 242 may be disposed in a Vcom electrode jumper layer. The Vcom electrode jumper layer may be referred to as metal layer three or a metal interconnect layer three. In one embodiment, conductive traces may be disposed on both a source drive layer and a Vcom electrode jumper layer. In various embodiments, the display device 160 may comprise a "dual gate" or half source driver" configuration, allowing conductive routing traces 240 and/or 242 to be disposed between source drivers on the source driver layer. In one or more embodiments, orthogonal directions of connections between the conductive routing traces 240 and 242 they may be place on separate layers with vias between them In some embodiments, the sectional area of the conductive routing traces 240 may vary. For example, the sectional area of the conductive routing traces 240 coupled to a sensor electrode 120 that is further from the processing system 110 relative to the sectional area of the conductive routing traces 240 coupled to a sensor electrode 120 that is closer to the processing system 110. The increased sectional area of the conductive routing traces 240 that extend farther from the processing system 110 functions to reduce the resistance of the conductive routing traces 240 coupled to the sensor electrodes 120 that are further from the processing system 110, thereby increasing device performance.

The grid electrode 122 is disposed between at least two of the sensor electrodes 120. The grid electrode 122 may at least partially circumscribe the plurality of sensor electrodes 120 as a group, and may also, or in the alternative, completely or partially circumscribe one or more of the sensor electrodes 120. In one embodiment, the grid electrode 122 is a planar body 212 having a plurality of apertures 210, each aperture 210 circumscribing a respective one of the sensor electrodes 120. Accordingly, the grid electrode 122 separates and circumscribes at least 3 or more of sensor electrodes 120, and in this example, separates and circumscribes all of sensor electrodes 120. The gap 206 spaces the body 212 from the sensor electrode 120 disposed in the aperture 210. In one or more embodiments, the grid electrode 122 is configured to substantially fill the space defined by the gap 206. In one embodiment a second grid electrode may be disposed on a substrate between grid electrode 122 and a touch input layer. The second grid electrode may be the same size as grid electrode 122, or larger than grid electrode 122 such that is overlaps one more sensor electrodes 120 and grid electrode or smaller than grid electrode 122 such that it overlaps a portion of the grid electrode 122. In various embodiments, the grid electrode 122 is disposed between at least two of sensor electrodes 120 such that the grid electrode 122 is on different layer (i.e., different substrate or side of the same substrate) and overlaps a portion of at least two sensor electrodes 120 and the gap between the sensor electrodes 120. In the embodiments where the sensor electrodes 120 comprise one or more common electrodes, the sensor electrodes 120 may comprise the entirety of the common electrode layer.

The grid electrode 122 may also be segmented. The segmentation of the grid electrode 122 may allow segments of the grid electrode 122 be less visible. The segments may be interconnect using traces or vias, so that the all the segments of the grid electrode 122 may be driven simultaneously with a common signal. Alternatively, one or more of the segments of the grid electrode 122 may be driven independently to facilitate scanning of the sensor electrodes 120 when configured as receiver electrodes in certain modes of operation as discussed further below.

An alternative grid electrode 122 that may be used in the input device 100 of FIG. 1 may comprise substantially more surface area than the sensor electrodes 120. For example, the grid electrode 122 may at least partially circumscribe one or more sensor electrodes 120. Additionally, or in the alternative, the grid electrode 122 may completely circumscribe at least one sensor electrode 120 and only partially circumscribes other sensor electrodes 120. In other embodiments, the grid electrode 122 may completely circumscribe all of the sensor electrodes 120. It is also contemplated that the grid electrode 122 may be segmented.

In another example, each sensor electrode 120 may be coupled to a different conductive routing trace 240 and to a common pin of processing system 110. For example, a multiplexer (or similar circuit element) may be coupled to the conductive routing trace or traces 240 so that the sensor electrodes 120 may be individually coupled to the processing system 110 when sharing a conductive routing trace 240. In one other example, each sensor electrode 120 may be coupled to a different conductive routing trace 240, where each conductive routing trace 240 is coupled to a different pin of processing system 110. Processing system 110 may be configured to simultaneously receive with multiple sensor electrodes 120 or receive with each sensor electrode 120 independently. In one embodiment, processing system 110 may be configured to receive with a plurality of sensor electrodes 120 using a scanning time multiplexed scheme when more than one grid electrode is driven with a transmitter signal. The grid electrodes 122 may be adjacent to each other or non-adjacent to each other. In one embodiment, two sensor electrodes may be simultaneously received with while grid electrode that corresponds to one of the sensor electrodes is driven with a transmitter signal.

Processing system 110 may be configured to simultaneously drive transmitter signals onto each grid electrode 122 and receive resulting signals with the sensor electrodes 120. In such an embodiment, each grid electrode 122 may be driven with a transmitter signal that is based on a different one of a plurality of digital codes. The digital codes may be any code such that they provide mathematical independent results. In one embodiment, the digital codes for the set of transmitters are substantially orthogonal—i.e., exhibit very low cross-correlation, as is known in the art. Note that two codes may be considered substantially orthogonal even when those codes do not exhibit strict, zero cross-correlation. In a particular embodiment, for example, the digital codes are pseudo-random sequence codes. In other embodiments, Walsh codes, Gold codes, or another appropriate quasi-orthogonal or orthogonal codes are used. In another embodiment, processing system 110 is configured to simultaneously drive the grid electrodes 122 with the same transmitter signal while independently receiving with the sensor electrodes 120. Some substantially orthogonal codes may be selected that have near zero sums which reduce the effect of the codes coupling to display elements, one set of such codes are circulant codes where each code vector is a rotation of the other vectors.

Processing system 110 may be configured to scan through the grid electrodes 122, driving transmitter signals on to the grid electrodes 122 one at a time, while receiving with the sensor electrodes 120. In one embodiment, only those sensor electrodes 120 that are circumscribed by the grid electrode 122 which is being driven are received with. In other embodiments, all of or some portion of the sensor electrodes 120 may be received with a grid electrode 122 that is being driven.

Processing system 110 may be configured to selectively configure the grid electrode 122 or sensor electrodes 120 based on the positional information of an input object 140. For example, in one embodiment, processing system 110 may drive transmitter signals onto the grid electrodes 122 such that the grid electrode is driven as one large grid electrode 122. Processing system 110 may selectively drive only a portion of the grid electrodes 122 that are proximate the detected input object or objects 140. In another embodiment, For example, in one embodiment, processing system 110 may drive shielding signals onto the grid electrodes 122 such that the grid electrode is driven as one large grid electrode 122. Further, processing system 110 may selectively drive only a portion of the grid electrodes 122 with a shielding signal that are proximate the detected input object or objects 140. In one embodiment the driving scheme (as discussed above) used to drive the grid electrode 122 may vary based on the positional information of the input object or objects 140.

Figure 3:
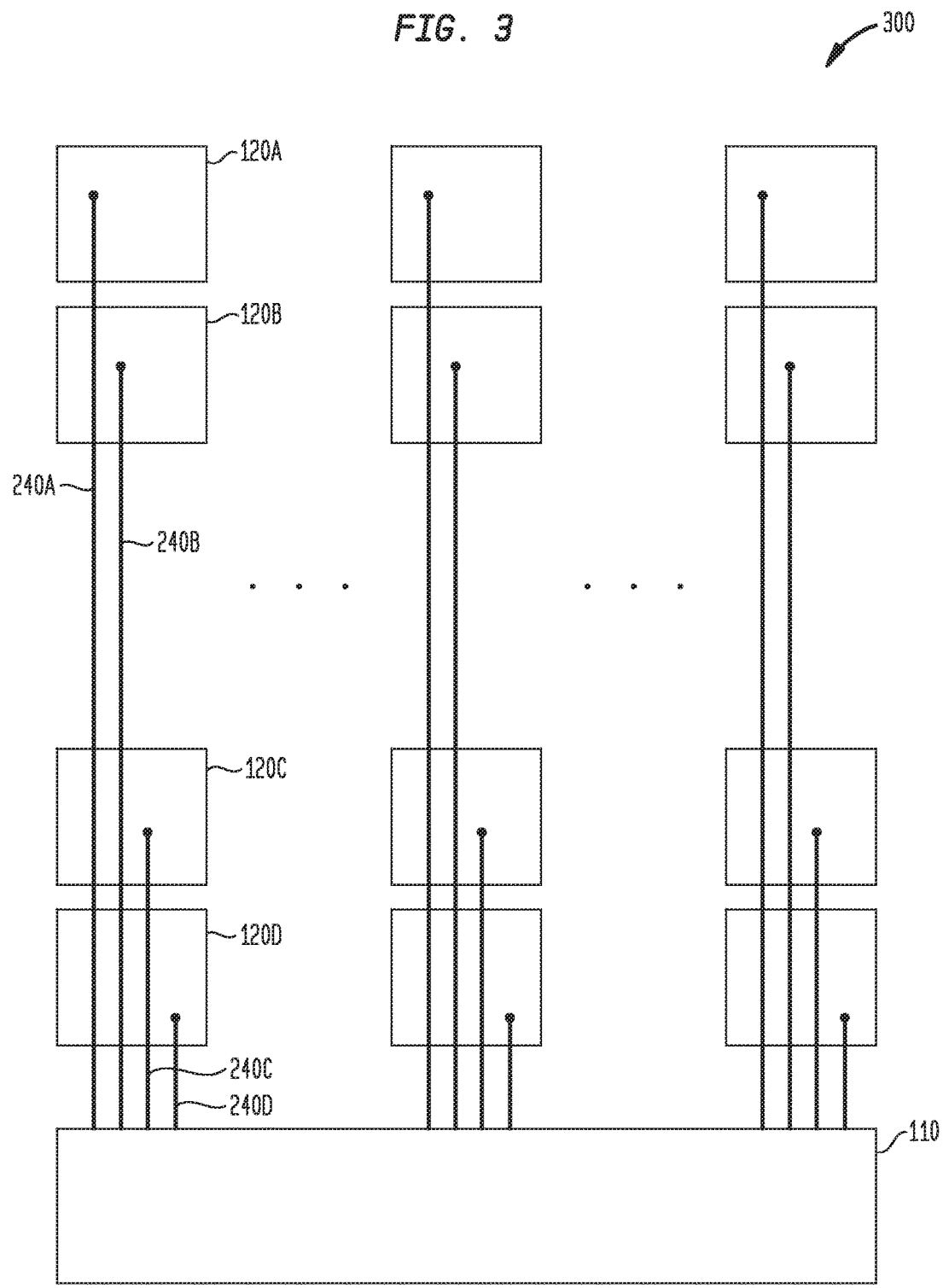
FIG. 3 illustrates a sample of sensor electrodes according to an example.

For large numbers of sensor electrodes 120, a large number of conductive routing traces 240 is required to couple the sensor electrodes 120 to the processing system 110, which may comprise an ASIC (application specific integrated circuit). For example, FIG. 3 illustrates a sample 300 of sensor electrodes 120. Four of the sensor electrodes are labeled 120A-120D. Each sensor electrode 120 is coupled to processing system 110 via a routing trace 240. Four example routing traces are labeled 240A-240D. These routing traces can cause background capacitance when the routing traces are at different voltage potentials. With potentially hundreds or thousands of routing traces, the amount of background capacitance can be relatively large. For transcapacitive sensing methods, described above, different sensor electrodes 120 may be modulated at different polarities or at different voltage potentials. Those differences cause the above-mentioned background capacitance.

In embodiments described herein, the background capacitance can be reduced or eliminated by utilizing specific modulation patterns for the sensor electrodes 120. That is, in this example, the individual wiring between the sensor electrodes 120 and the processing system 110 is traveling in a vertical direction. If the sensor electrodes 120 in a vertical column are modulated the same way, capacitance between the sensor electrodes 120 can be reduced. The voltage potential along each of the routing traces 240 in a column will be the same, which reduces background capacitance between these closely situated routing traces 240.

FIG. 4A illustrates transmitter and receiver excitation patterns where the sensor electrodes 120 are aligned vertically during a scan. In this example, 21 columns and 36 rows of sensor electrodes 120 are illustrated, but any suitable number may be used in other embodiments. The shading of the columns of sensor electrodes 120 illustrates whether the sensor electrodes 120 in that column are assigned as a transmitter, receiver, or idle for a given scan. In this example, a group of three columns comprises a sensing node. The sensing node includes two columns comprising transmitter sensor electrodes 120 and one column comprising receiver sensor electrodes 120. Columns of sensor electrodes 120 that are assigned as transmitter electrodes are shaded darkly. Columns of sensor electrodes 120 that are idle are shaded lightly. The unshaded columns of sensor electrodes 120 act as receiver electrodes. In one embodiment, receiver sensor electrodes 120 in the same row are routed to a single analog front end (AFE) input of a touch display driver integrated circuit. The measurement from each AFE is used to determine the vertical profile of the object subject to detection. In another embodiment, more AFEs could be utilized so that each row of receiver sensor electrodes 120 sends signals to more than one AFE.

The columns of transmitter electrodes 120 are used to determine the horizontal profile of the object in the sensing region. In this example excitation pattern, each receiver column is positioned between two transmitter columns so that the effective capacitance measurement on the receiver is the sum of the two transmitter electrode columns. This pattern uses seven sets of three columns each to acquire seven separate measurements (the seven sets are otherwise known as seven sensing nodes). The scan is repeated seven times. Each time, the determination of whether a transmitter is modulated or idle is determined by an element in a code division multiplexing (CDM) matrix. An example CDM excitation pattern is described below, but the CDM excitation pattern can vary in other embodiments.

In other embodiments, the number of columns in each set can vary from one scan to another. The ratio of transmitter and receiver count in each set can also be varied. For example, there may be one transmitter column for each receiver column in another embodiment, instead of two transmitter columns for each receiver column as illustrated here. FIG. 6, described below, illustrates an example embodiment where a sensing node comprises one transmitter column and one receiver column.

In FIG. 4A, three of the seven CDM excitation patterns for the sensor electrodes 120 are illustrated. Excitation pattern 400-1 is shown on the left of the figure. In this pattern, the first three sets of three columns are each modulated. The next two sets of columns are idle. The next set of columns is modulated, and the final set of columns is idle. The excitation pattern is determined by the CDM matrix, which is discussed in further detail below. Therefore, for this excitation pattern, the seven sensing nodes are arranged, from left to right, as MMMIIMI (where M=modulated and I=idle).

For excitation pattern 400-2, the first set of three columns is idle. The next three sets of columns are modulated, the two sets of columns after that are idle, and the final set of columns is modulated. As shown, the excitation pattern 400-2 is shifted by one set of electrodes to the right compared to excitation pattern 400-1. For example, the pattern in the first excitation pattern 400-1 was MMMIIMI (where M=modulated and I=idle). The pattern for excitation pattern 400-2 is IMMMIIM. The pattern for the third excitation pattern (not illustrated) is MIMMMII. The pattern continues to shift by one set of columns of electrodes 120 to the right until all seven excitation patterns have been completed. Patterns three through six are omitted from the figure for simplicity. The seventh excitation pattern 400-7 is illustrated. The cycle can start over after seven scans have been performed.

Measurements are acquired during each of the seven scans corresponding to the seven excitation patterns. After the seven scans, the total measurement can be obtained. For any given row of sensor electrodes 120, the response of the input object 140 along the rows is obtained after the seven scans, when a convolution is performed, as described below in FIGS. 5, 7A, and 7B. The measurements along these seven sensing nodes for each row capture the entire response of the input object 140 on the two-dimensional collection of sensor electrodes 120.

Figure 4B:
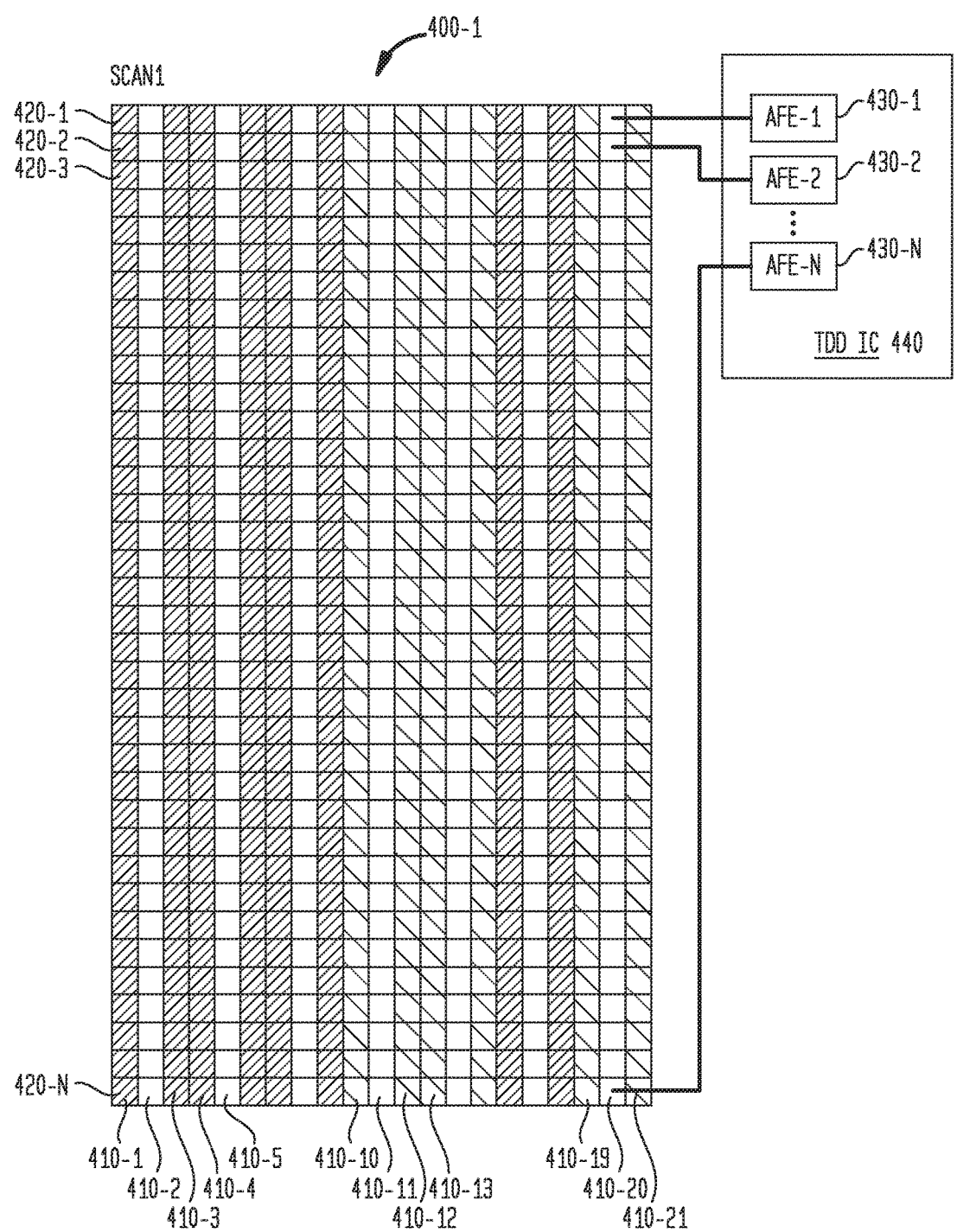
FIG. 4B illustrates another view of transmitter and receiver excitation patterns according to an example.

FIG. 4B illustrates another view of transmitter and receiver excitation patterns according to an example. Specifically, FIG. 4B is a magnified view of excitation pattern 400-1 illustrated in FIG. 4A. As described above, 21 columns and 36 rows of sensor electrodes 120 are illustrated in this example. The columns in FIG. 4B are labeled 410-1, 410-2, 410-3, etc., up to 410-21. Only some of the columns are labeled for simplicity. In addition, the rows 420 are labeled on the left hand side of FIG. 4B as 420-1, 420-2, etc., up to 420-N. In this example, N is 36.

As described above, receiver sensor electrodes 120 in the same row 420 can be routed to a single analog front end input 430 of a touch display driver integrated circuit (TDD IC) 440. AFE inputs are illustrated as inputs 430-1, 430-2, etc., up to 430-N. In other embodiments, multiple AFE inputs may be used for each row of sensor electrodes 120.

TDD IC 440 comprises processing circuitry operable to receive measurements from the sensor electrodes 120 and determine a location of the input object 140 based on those measurements. TDD IC 140 may comprise a component of processing system 110 in some embodiments.

As also described above, a set of three columns comprises a node. This embodiment utilizes seven sensing nodes. The first node includes columns 410-1, 410-2, and 410-3. Columns 410-1 and 410-3 are darkly shaded and therefore they are modulated during this first excitation pattern 400-1. Column 410-2 is unshaded, and acts as the receiver electrode for the transmitter electrodes 410-1 and 410-3. The next two sets of three columns to the right of this first node (i.e., the next two nodes) are also modulated during this excitation pattern.

The fourth node comprises columns 410-10, 410-11, and 410-12. Columns 410-10 and 410-12 are lightly shaded, and therefore they are idle during this excitation pattern. Column 410-11 acts as the receiver electrode for this node. The last node on the right side of the excitation pattern 400-1 is also idle. The last node comprises columns 410-19, 410-20, and 410-21.

During the CDM excitation patterns, the sensor electrodes 120 in the receiver columns (the unshaded columns) receive measurements and transmit those measurements to the respective AFEs 430. In this embodiment, each receiver sensor electrode 120 in a given row 420 sends its measurement to a single AFE 430. That is, the sensor electrodes 120 in row 420-1 send their measurements to AFE 430-1; the sensor electrodes 120 in row 420-2 send their measurements to AFE 430-2, etc. In this embodiment 36 AFEs are used to receive measurements in TDD IC 440. These measurements are collected and a deconvolution is performed by a processing system to retrieve a capacitive image and determine the location of an input object 140 in the sensing region 170.

Figure 5:
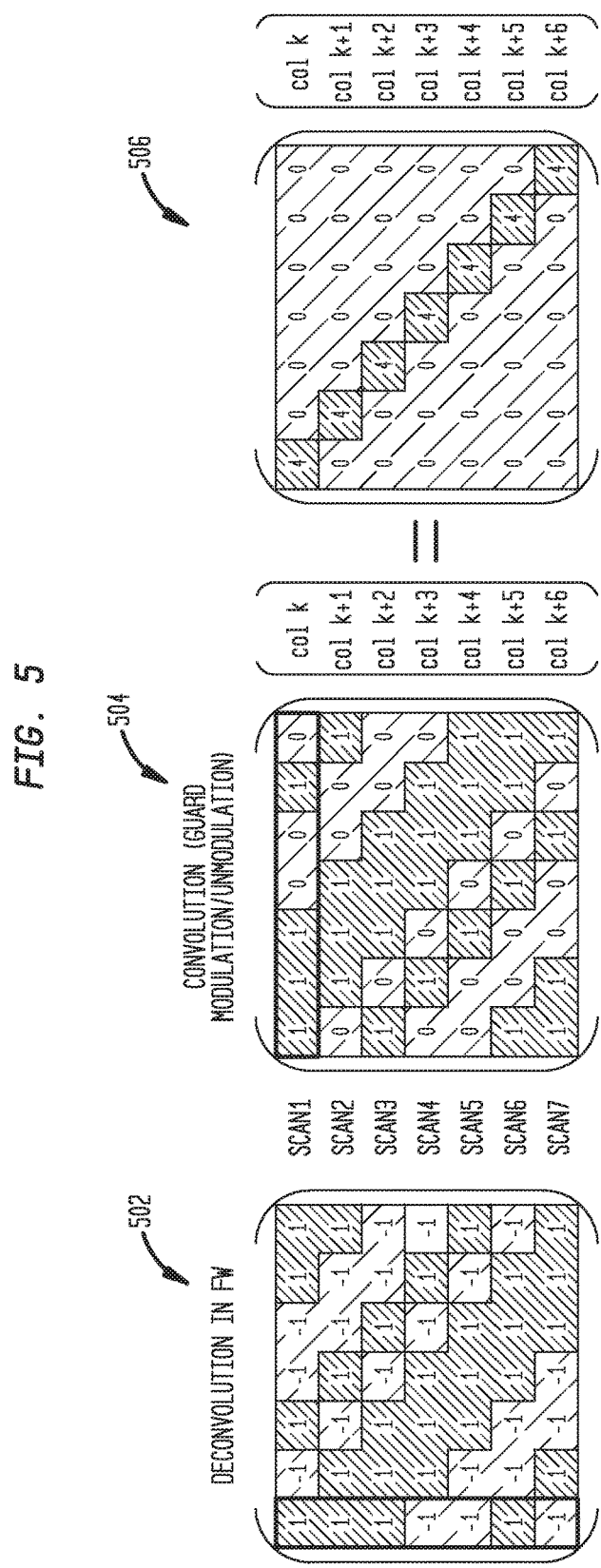
FIG. 5 illustrates an example deconvolution for the excitation patterns illustrated in FIG. 4A.

FIG. 5 illustrates an example deconvolution for the excitation patterns illustrated in FIG. 4A and described above. That is, measurements are taken and stored during the excitation patterns as illustrated in FIGS. 4A and 4B and then those measurements are processed to determine a capacitive image of an object in the sensing region. FIG. 5 illustrates the processing that occurs to determine the capacitive image. Matrix 504 illustrates the excitation pattern along the rows. The top row of matrix 504 shows the excitation pattern 400-1 (MMMIIMI), where a 1 represents a modulated node and a 0 represents an idle node. The second row of matrix 504 illustrates the excitation pattern 400-2, and the other excitation patterns are illustrated in order in the corresponding rows of matrix 504. The matrix 504 (convolution) is applied on the column of receivers by way of transmitter excitation. Then, matrix 502 shows the deconvolution performed by processing system 110. After the deconvolution operation, the result is matrix 506, which is the identity matrix.

The matrix 502 illustrates a deconvolution performed by a processing system, such as processing system 110. The first column of matrix 502 is highlighted. This column illustrates the first multiplication and addition to be applied on the first excitation pattern 400-1 shown in FIG. 4A. In this column, a 1 represents multiply by 1 and add, while a −1 indicates multiply by 1 and subtract. The first column thus shows the pattern as MMMIIMI, whose dot product with the excitation pattern 400-1 corresponds to the element of the first row and the first column of matrix 506. The second column shows the pattern as IMMMIIM, whose dot product with the excitation pattern 400-2 corresponds to the element of the second row and second column of matrix 506. The columns continue illustrating the multiplication and addition patterns in this manner until all seven patterns are illustrated in matrix 502.

As described above, applying the same potential to each sensor electrode 120 in a given column reduces background capacitance. The voltage potential along each of the routing traces 240 in a column will be the same, which reduces background capacitance between these closely situated routing traces 240.

FIG. 6 illustrates another embodiment of a CDM excitation pattern. In this embodiment, transmitter and receiver electrodes alternate and are positioned at every other column. CDM scans are performed as described above, where each transmitter is either modulated or not modulated according to a defined CDM matrix. In this embodiment, an "even" scan is performed where the even-numbered columns are receivers and the odd-numbered columns are transmitters, as illustrated in pattern 600-1. Then, an "odd" scan is performed where the odd-numbered columns are receivers and the even-numbered columns are transmitters, as illustrated in pattern 600-2.

In this example embodiment, pattern 600-1 illustrates a matrix of sensor electrodes 120 that comprises 22 columns and 36 rows. Any suitable number of rows and columns may be used in other embodiments. In this pattern, the even-numbered columns are shown as unshaded (e.g., Col. 2, Col. 4, Col. 6, etc.), and the sensor electrodes 120 in those columns act as receivers. The sensor electrodes 120 in the odd-numbered columns (e.g., Col. 1, Col. 3, Col. 5, etc.), act as transmitters. In the CDM pattern illustrated in excitation pattern 600-1, the lightly shaded columns are idle, while the darkly shaded columns are modulated. In pattern 600-1, the nodes in the pattern shown are IIMMMIMMIM. That is, the first three nodes (transmitter-receiver column pairs) are idle, while the next three nodes are modulated, and so forth according the pattern. In the previous example illustrated in FIG. 4A, seven nodes were used in the excitation pattern. In this example of FIG. 6, eleven nodes are used.

After the "even" scan of pattern 600-1 is performed, an "odd" scan is performed, as illustrated in pattern 600-2. In pattern 600-2, the odd columns act as receivers, while the even columns are either modulated or idle. Because pattern 600-2 is the same pattern as pattern 600-1, except applied to different columns, the nodes in pattern 600-2 are also arranged as IIMMMIMMIM. After a scan is performed using pattern 600-1, a second scan is performed using pattern 600-2. This set of "even" and "odd" scans allows the acquisition of measurements from all sensor electrodes 120 along a given row.

Once an "even" scan and an "odd" scan have been performed, the CDM pattern is shifted by one node to the right for the next set of even/odd scans to be performed. This is similar to the shifting process of CDM patterns described above with respect to FIG. 4A. Although not illustrated, the next pattern after the "odd" scan of pattern 600-2 would be an "even" scan with the CDM pattern MIIIMMMIMMI. The modulation pattern of the nodes in this pattern is shifted one node to the right. Then, the "odd" scan would be performed for this CDM pattern. After that, a second shift would occur, and another set of "even" and "odd" scans would occur. The "shifting" process is repeated 10 times until the CDM pattern has cycled through an "even" and "odd" scan for all eleven positions.

After the eleven patterns are scanned, the total measurement can be obtained. For any given row of sensor electrodes 120, the response of the input object 140 along the rows is obtained after the eleven scans, when a convolution is performed, as described below. The measurements along these eleven nodes for each row capture the entire response of the input object 140 on the two-dimensional collection of sensor electrodes 120.

FIG. 7A illustrates an example deconvolution for the excitation patterns illustrated in FIG. 6. That is, measurements are taken and stored during the excitation patterns as illustrated in FIG. 6 and then those measurements are processed to determine a capacitive image of an object in the sensing region. FIGS. 7A and 7B illustrate the processing that occurs to determine the capacitive image. The three matrices (702, 704, and 706) illustrate the Even Scan, as shown in pattern 600-1 of FIG. 6. FIG. 7B shows three matrices (708, 710, and 712) that illustrate the Odd Scan, as shown in pattern 600-2 of FIG. 6. Similar to FIG. 5 above, the matrix 704 (convolution) is applied on the column of receivers by way of transmitter excitation. Then, matrix 702 shows the deconvolution performed by processing system 110. After the deconvolution operation, the result is matrix 706, which is the identity matrix.

Matrix 704 illustrates the excitation pattern along the rows. The top row of matrix 704 is highlighted and shows the excitation pattern 600-1 (IIMMMIMMIM), where a 1 represents a modulated node and a 0 represents an idle node. The second row of matrix 704 illustrates the second excitation pattern shifted one column to the right, and the other excitation patterns are illustrated in order in the corresponding rows of matrix 704.

FIG. 7B illustrates the Odd Scan. Similar to FIG. 7A, the matrix 710 (convolution) is applied on the column of receivers by way of transmitter excitation. Then, matrix 708 shows the deconvolution performed by processing system 110. After the deconvolution operation, the result is matrix 712, which is the identity matrix.

FIG. 8 is a flow diagram of method steps 800 for CDM excitation according to an example. Although the method steps 800 are described in conjunction with FIGS. 1-7 above, persons skilled in the art will understand that any system configured to perform the method steps 800, in any suitable order, falls within the scope of the present invention. In various embodiments, the hardware and/or software elements described above in FIGS. 1-7 can be configured to perform the method steps 800 of FIG. 8. In the accompanying description, "first column," "second column," etc. refers to any appropriate column as illustrated in the figures and described herein, and not necessarily to the first column or second column, etc., of sensor electrodes from one of the edges of the CDM modulation pattern.

The method 800 begins with step 810, where a processing system 110 drives a first column of transmitter sensor electrodes 120 at a first potential. Driving an entire column of sensor electrodes 120 at the same potential reduces background capacitance between the sensor electrodes 120 and metal routing lines 240. Referring to FIG. 4B, the first column of transmitter sensor electrodes 120 is column 410-1 in one example. In FIG. 4B, a sensing node comprises three columns of sensor electrodes 120: two columns acting as transmitter sensor electrodes and one column acting as receiver sensor electrodes. As shown in FIG. 4B, column 410-1 is shaded darkly, which means this column of sensor electrodes 120 comprises transmitter sensor electrodes that are modulated at this point in the CDM modulation pattern.

In the embodiment illustrated in FIG. 6, a sensing node comprises only two columns of sensor electrodes 120: one column of sensor electrodes 120 acting as transmitter electrodes and one column of sensor electrodes 120 acting as receiver electrodes. In FIG. 6, the first column of transmitter sensor electrodes comprises the leftmost column of pattern 600-1, which is lightly shaded. A lightly shaded column is idle according to the CDM modulation pattern.

The method proceeds to step 820, where the processing system 110 drives a second column of transmitter sensor electrodes 120 at a second potential different than the first potential. Driving each sensor electrode 120 in this column of sensor electrodes 120 at the same potential reduces background capacitance for this column of sensor electrodes 120. Referring again to FIG. 4B, the second column of transmitter sensor electrodes 120 could be column 410-19 in this example. As shown in FIG. 4B, column 410-19 is shaded lightly, which means this column of sensor electrodes 120 comprises transmitter sensor electrodes at this point in the CDM modulation pattern, but those sensor electrodes 120 are currently idle according to the CDM pattern (idle electrodes are shaded lightly). The shading in the figure illustrates the potential of the sensor electrodes 120 in the column. Therefore the second column of transmitter electrodes 410-19 is driven at a potential that is different than the first column of transmitter electrodes, which is column 410-1.

In the embodiment illustrated in FIG. 6, the second column of transmitter sensor electrodes 120 comprises the second column from the right edge of pattern 600-1, which is darkly shaded. According to the CDM modulation pattern, the darkly shaded columns are modulated. Therefore this column is at a different potential than the leftmost column of pattern 600-1, which is lightly shaded and therefore idle during this portion of the CDM modulation pattern.

At step 830, the processing system 110 acquires a measurement from each row of sensor electrodes, where the first column of transmitter sensor electrodes and a third column of receiver sensor electrodes comprises a first sensing node, and the second column of transmitter sensor electrodes and a fourth column of receiver sensor electrodes comprises a second sensing node. The measurement from each row of sensor electrodes can be transmitted to an analog front end input of a touch display driver integrated circuit. The collective set of measurements is then utilized to determine the location of an input object 140. Referring again to FIG. 4B, the third column of receiver sensor electrodes 120 could be column 410-2 in this example. The sensor electrodes 120 in column 410-2 act as receiver sensor electrodes for columns 410-1 and 410-3. As noted above, this embodiment illustrated in FIG. 4B utilizes two columns of transmitter sensor electrodes 120 and one column of receiver sensor electrodes 120 as a sensing node. Therefore columns 410-1 (the first column of transmitter sensor electrodes) and column 410-2 (the third column of receiver sensor electrodes) comprise, at least in part, the first sensing node.

In FIG. 4B, in this example, the fourth column of receiver sensor electrodes is column 410-20. The sensor electrodes in column 410-20 act as receiver sensor electrodes for columns 410-19 and 410-21. Columns 410-19 (the second column of transmitter sensor electrodes) and column 410-20 (the fourth column of receiver sensor electrodes) comprise, at least in part, the second sensing node.

With respect to FIG. 6, in pattern 600-1 the third column of receiver sensor electrodes 120 comprises the second column from the left edge of the pattern, which is unshaded. An unshaded column acts as a receiver according to the CDM modulation pattern. In this embodiment, the leftmost column (i.e., the first column of transmitter sensor electrodes) and the second column from the left (i.e., the third column of receiver sensor electrodes) comprise the first sensing node.

In FIG. 6, the fourth column of receiver sensor electrodes 120 is the rightmost column of pattern 600-1, which is unshaded. The rightmost column and the second column from the right (i.e., the second column of transmitter sensor electrodes) comprise the second sensing node.

In one embodiment, each row of sensor electrodes sends a measurement to an analog front end input for a given scan. After the excitation pattern changes for the next scan, another measurement is sent to the analog front end input from each row of sensor electrodes. This process continues throughout the entire excitation pattern.

The method proceeds to step 840, where the processing system 110 determines, using the measurements from each row of sensor electrodes, a first set of transcapacitive measurements corresponding to the plurality of sensor electrodes. These transcapacitive measurements are used to determine the location of an input object 140 in the sensing region 170 of the touch input device 100.

As described above, in one embodiment the first sensing node and the second sensing node each comprise two columns of transmitter sensor electrodes and one column of receiver sensor electrodes. In this embodiment, the first sensing node comprises columns 410-1, 410-2, and 410-3 in FIG. 4B. These three columns collectively comprise the first sensor node illustrated on CDM excitation pattern 400-1 in FIG. 4B. As another example, the second sensing node may comprise columns 410-10, 410-11, and 410-12 in FIG. 4B. The second sensing node may also comprise columns 410-19, 410-20, and 410-21.

In another embodiment, the first sensing node and the second sensing node each comprise one column of transmitter sensor electrodes and one column of receiver sensor electrodes, as illustrated in FIG. 6. The columns of receiver sensor electrodes are unshaded in FIG. 6, while the columns of transmitter sensor electrodes are shaded either darkly or lightly, depending on the CDM modulation pattern.

Thus, the embodiments and examples set forth herein were presented in order to best explain the embodiments in accordance with the present technology and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

In view of the foregoing, the scope of the present disclosure is determined by the claims that follow.

What is claimed is:

1. A method for detecting a presence of an input in a capacitive sensing device, wherein the capacitive sensing device comprises a sensing region comprised of a plurality of sensor electrodes, comprising:
   driving a first column of transmitter sensor electrodes at a first potential;
   driving a second column of transmitter sensor electrodes at a second potential different than the first potential;
   acquiring a measurement from each row of sensor electrodes, wherein the first column of transmitter sensor electrodes and a third column of receiver sensor electrodes comprise a first sensing node, and the second column of transmitter sensor electrodes and a fourth column of receiver sensor electrodes comprise a second sensing node, wherein the columns of transmitter sensor electrodes are substantially parallel to their respective columns of receiver sensor electrodes; and
   determining, using the measurements from each row of sensor electrodes, a first set of transcapacitive measurements corresponding to the plurality of sensor electrodes.

2. The method of claim 1, wherein the first sensing node and the second sensing node each comprise two columns of transmitter sensor electrodes and one column of receiver sensor electrodes.

3. The method of claim 1 further comprising:
   determining a second set of transcapacitive measurements corresponding to the plurality of sensing electrodes by driving the first column of transmitter sensor electrodes at the second potential according to a code division multiplexing pattern.

4. The method of claim 3, wherein the first set of transcapacitive measurements, the second set of transcapacitive measurements, and one or more additional sets of transcapacitive measurements are collected and used to determine a horizontal profile of the input in the sensing region.

5. The method of claim 1, where the first potential and the second potential are determined by a code division multiplexing pattern.

6. The method of claim 1, wherein each receiver sensor electrode in a row of receiver sensor electrodes is routed to an analog front end input of a touch display driver.

7. The method of claim 6, wherein a vertical profile of the input in the sensing region is determined by a measurement from one or more analog front end inputs.

8. An input device for capacitive sensing, comprising:
   a capacitive touch sensor configured to:
      sense a presence of an input in a sensing region comprising a plurality of sensor electrodes; and
   a processing system configured to:
      drive a first column of transmitter sensor electrodes at a first potential;
      drive a second column of transmitter sensor electrodes at a second potential different than the first potential;
      acquire a measurement from each row of sensor electrodes, wherein the first column of transmitter sensor electrodes and a third column of receiver sensor electrodes comprise a first sensing node, and the second column of transmitter sensor electrodes and a fourth column of receiver sensor electrodes comprise a second sensing node, wherein the columns of transmitter electrodes are substantially parallel to their respective columns of receiver electrodes; and
      determine, using the measurements from each row of sensor electrodes, a first set of transcapacitive measurements corresponding to the plurality of sensor electrodes.

9. The input device of claim 8, wherein the first sensing node and the second sensing node each comprise two columns of transmitter sensor electrodes and one column of receiver sensor electrodes.

10. The input device of claim 8, further comprising:
    determining a second set of transcapacitive measurements corresponding to the plurality of sensing electrodes by driving the first column of transmitter sensor electrodes at the second potential according to a code division multiplexing pattern.

11. The input device of claim 10, wherein the first set of transcapacitive measurements, the second set of transcapacitive measurements, and one or more additional sets of transcapacitive measurements are collected by the processing system and used to determine a horizontal profile of the input in the sensing region.

12. The input device of claim 8, where the first potential and the second potential are determined by a code division multiplexing pattern.

13. The input device of claim 8, wherein each receiver sensor electrode in a row of receiver sensor electrodes is routed to an analog front end input of a touch display driver.

14. The input device of claim 13, wherein a vertical profile of the input in the sensing region is determined by a measurement from one or more analog front end inputs.

15. A processing system for a capacitive sensing device, the processing system comprising:
a sensor module configured to:
sense a presence of an input in a sensing region comprising a plurality of sensor electrodes; and
processing circuitry configured to:
drive a first column of transmitter sensor electrodes at a first potential;
drive a second column of transmitter sensor electrodes at a second potential different than the first potential;
acquire a measurement from each row of sensor electrodes, wherein the first column of transmitter sensor electrodes and a third column of receiver sensor electrodes comprise a first sensing node, and the second column of transmitter sensor electrodes and a fourth column of receiver sensor electrodes comprise a second sensing node, wherein the columns of transmitter electrodes are substantially parallel to their respective columns of receiver electrodes; and
determine, using the measurements from each row of sensor electrodes, a first set of transcapacitive measurements corresponding to the plurality of sensor electrodes.

16. The processing system of claim 15, wherein the first sensing node and the second sensing node each comprise two columns of transmitter sensor electrodes and one column of receiver sensor electrodes.

17. The processing system of claim 15, wherein the processing circuitry is further configured to:
determine a second set of transcapacitive measurements corresponding to the plurality of sensing electrodes by driving the first column of transmitter sensor electrodes at the second potential according to a code division multiplexing pattern.

18. The processing system of claim 17, wherein the first set of transcapacitive measurements, the second set of transcapacitive measurements, and one or more additional sets of transcapacitive measurements are collected by the processing system and used to determine a horizontal profile of the input in the sensing region.

19. The processing system of claim 15, where the first potential and the second potential are determined by a code division multiplexing pattern.

20. The processing system of claim 15, wherein each receiver sensor electrode in a row of receiver sensor electrodes is routed to an analog front end input of a touch display driver.

* * * * *